(12) United States Patent
Fowler (10) Patent No.: US 10,128,296 B2
(45) Date of Patent: *Nov. 13, 2018

(54) IMAGING ARRAY WITH IMPROVED DYNAMIC RANGE UTILIZING PARASITIC PHOTODIODES

(71) Applicant: BAE Systems Imaging Solutions Inc., San Jose, CA (US)

(72) Inventor: Boyd Fowler, Sunnyvale, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 381 days.

This patent is subject to a terminal disclaimer.

(21) Appl. No.: 14/591,873

(22) Filed: Jan. 7, 2015

(65) Prior Publication Data

US 2015/0122974 A1    May 7, 2015

Related U.S. Application Data

(63) Continuation-in-part of application No. 13/936,974, filed on Jul. 8, 2013, now Pat. No. 9,412,782.

(51) Int. Cl.
*H01L 27/146* (2006.01)
*H04N 5/355* (2011.01)

(52) U.S. Cl.
CPC .. *H01L 27/14643* (2013.01); *H01L 27/14609* (2013.01); *H01L 27/14612* (2013.01); *H01L 27/14656* (2013.01); *H04N 5/35563* (2013.01)

(58) Field of Classification Search
CPC ............. H01L 27/146; H01L 27/14656; H01L 27/14612; H01L 27/14601;
(Continued)

(56) References Cited

U.S. PATENT DOCUMENTS 7,105,793 B2 *  9/2006  Rhodes ............ H01L 27/14627
                                                    250/208.1
7,554,170 B2 *  6/2009  Raynor ................. H04N 3/155
                                                       257/113
(Continued)

FOREIGN PATENT DOCUMENTS

EP      2 109 306     10/2009

OTHER PUBLICATIONS

Supplementary European Search Report, EP 14822494, dated Dec. 12, 2016. 9 pages.

*Primary Examiner* — Que T Le
*Assistant Examiner* — Jennifer Bennett
(74) *Attorney, Agent, or Firm* — Calvin B. Ward (57) ABSTRACT

A pixel sensor having a main photodiode and a parasitic photodiode and a method for reading out that pixel sensor are disclosed. The parasitic photodiode also serves the function of a floating diffusion node in the pixel. The pixel sensor is read by first determining the exposure as measured by the parasitic photodiode and then determining the exposure as read by the main photodiode. One of the two exposure measurements is chosen as the pixel output. The main photodiode has a light conversation efficiency chosen such that one of the two measurements will provide a measurement of the exposure over a dynamic range that is greater than that of either the main photodiode or the parasitic photodiode utilized separately.

8 Claims, 5 Drawing Sheets

(58) Field of Classification Search
CPC ......... H01L 27/14643; H01L 27/15654; H01L 27/14609; H01L 27/1461; H04N 5/335; H04N 5/35563; H04N 5/3559; H04N 5/378; H04N 5/2253; H04N 5/3745
See application file for complete search history.

(56) References Cited

U.S. PATENT DOCUMENTS

| | | | |
|---|---|---|---|
| 8,253,810 B2* | 8/2012 | Myers | H04N 5/23248 348/208.1 |
| 9,412,782 B2* | 8/2016 | Fowler | H01L 27/14643 |
| 2006/0266922 A1* | 11/2006 | McGrath | H01L 27/14609 250/208.1 |
| 2007/0029469 A1 | 2/2007 | Rhodes | |
| 2009/0002528 A1* | 1/2009 | Manabe | H04N 5/2355 348/248 |
| 2009/0057735 A1* | 3/2009 | Beak | H01L 27/14603 257/292 |
| 2010/0002118 A1* | 1/2010 | Wang | H04N 3/155 348/308 |

* cited by examiner

IMAGING ARRAY WITH IMPROVED DYNAMIC RANGE UTILIZING PARASITIC PHOTODIODES

RELATED APPLICATIONS

This application is a continuation-in-part of U.S. patent application Ser. No. 13/936,974 filed on 8 Jul. 2013.

BACKGROUND OF THE INVENTION

CMOS imaging sensors are widely used in cameras and other imaging applications. The imaging sensors typically include a two-dimensional array of pixel sensors. Each pixel sensor includes a photodiode that measures the image intensity at a corresponding point in the image. The dynamic range of the image sensor is the ratio of the minimum amount of light that can be measured to the maximum amount. An image is formed by first emptying the photodiodes of any accumulated charge and then exposing the photodiodes to the image. Each photodiode accumulates charge at a rate determined by the light intensity emitted by the image at the corresponding point in the image, referred to as a pixel. In general, the amount of charge that can be accumulated in a photodiode has a maximum value, referred to as the maximum well capacity. Once this capacity is reached, the excess charge is removed from the pixel through a special gate that shunts the excess charge to ground to prevent artifacts in the image. The minimum charge that can be detected is determined by noise.

In principle, the maximum well capacity can be increased by utilizing larger photodiodes; however, this solution increases the cost of the imaging array and requires processing electronics that can deal with the larger dynamic range of the signals generated by the pixels. Another prior art solution for increasing the dynamic range of the imaging array involves using two different photodiodes for each pixel. In this solution, a large area photodiode is used to measure low light levels and a smaller photodiode is used to measure intensities at the brighter locations in the image. If the pixel is exposed to a high brightness location, the smaller photodiode is used. At dim locations in the image, the larger photodiode is used. This solution requires two different sets of photodiodes and the increased silicon area associated with the additional photodiodes that measure the high brightness locations in the image.

A second prior art solution uses multiple exposures to provide the increased dynamic range. In this solution, basically two pictures are taken of each scene. A first picture uses a very short exposure time which captures the intensities of the high brightness points in the image. Pixels at low intensity points in the image are underexposed. The second picture uses a much longer exposure period. In the second picture, the pixels at the high intensity points are overexposed, while the pixels at the low intensity points are now adequately exposed and provide the intensity values at the low intensity points. The two pictures are then combined to provide an image with increased dynamic range. This approach, however, leads to artifacts in the image, as the two pictures are separated in time by an amount that can be a problem if the scene is rapidly changing.

SUMMARY OF THE INVENTION

The present invention includes a pixel sensor, a method for measuring a light exposure using that pixel sensor, and memory arrays constructed from that pixel sensor. A pixel sensor according to the present invention includes a photodiode, a floating diffusion node, and a readout amplifier. The photodiode is characterized by a first light conversion efficiency. A gate selectively connects the photodiode to the floating diffusion node. The readout amplifier generates a signal indicative of a potential on the floating diffusion node. The floating diffusion node includes a parasitic photodiode characterized by a second light conversion efficiency, the second light conversion efficiency is greater than or equal to $\frac{1}{30}$ times the first light conversion efficiency.

In one aspect of the invention, the pixel sensor includes an overflow gate connected to the photodiode, the overflow gate removing charge from the photodiode if a potential on the photodiode exceeds an overflow potential.

The method generating a signal indicative of a light exposure by the pixel sensor includes resetting the floating diffusion node to a first potential. Then the pixel sensor is exposed to light such that the floating diffusion node is also exposed to the light. A second potential on the floating diffusion node is read while the floating diffusion node is isolated from the photodiode, and a first exposure is determined from the first and second potentials. A second exposure is determined by resetting the floating diffusion node to a third potential, connecting the photodiode to the floating diffusion node, and reading a fourth potential on the floating diffusion node. The second exposure is determined from the third and fourth potentials.

In one aspect of the invention, the floating diffusion node is reset to the first potential by connecting the floating diffusion node to a reset bus having a first reset potential and then disconnecting the floating diffusion node from the reset bus prior to reading the first potential.

DETAILED DESCRIPTION OF THE INVENTION

Figure 1:
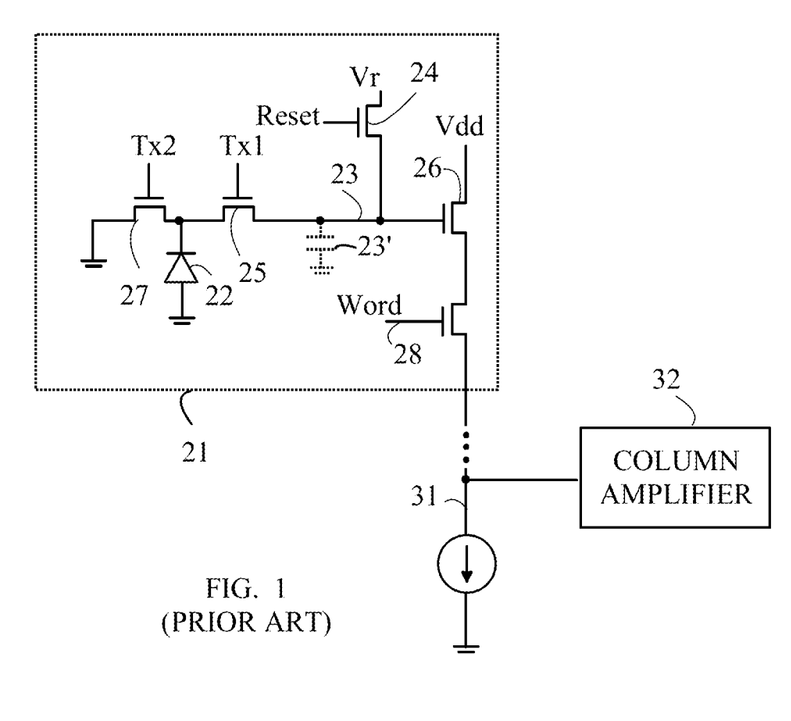
FIG. 1 is a schematic drawing of a typical prior art pixel sensor in one column of pixel sensors in an imaging array.

The manner in which the present invention provides its advantages can be more easily understood with reference to FIG. 1, which is a schematic drawing of a typical prior art pixel sensor in one column of pixel sensors in an imaging array. Pixel sensor 21 includes a photodiode 22 that measures the light intensity at a corresponding pixel in the image. Initially, photodiode 22 is reset by placing gate 25 in a conducting state and connecting floating diffusion node 23 to a reset voltage, Vr. Gate 25 is then closed and photodiode 22 is allowed to accumulate photoelectrons. A potential on gate 27 sets the maximum amount of charge that can be accumulated on photodiode 22. If more charge is accumulated than allowed by the potential on gate 27, the excess charge is shunted to ground through gate 27.

After photodiode 22 has been exposed, the charge accumulated in photodiode 22 is typically measured by noting the change in voltage on floating diffusion node 23 when the accumulated charge from photodiode 22 is transferred to floating diffusion node 23. For the purposes of the present discussion, a floating diffusion node is defined to be an electrical node that is not tied to a power rail, or driven by another circuit. In the pixel shown in FIG. 1, one source/drain side of the transfer gate transistor and the drain side of the pixel reset transistor are tied together. When neither gate of these transistors is active, the connected source/drain diffusions are considered to be one floating diffusion node. Floating diffusion node 23 is characterized by a capacitance represented by capacitor 23'. In practice, capacitor 23' is charged to a voltage Vr and isolated by pulsing the reset line of gate 24 prior to floating diffusion node 23 being connected to photodiode 22. The charge accumulated on photodiode 22 is transferred to floating diffusion node 23 when gate 25 is opened. The voltage on floating diffusion node 23 is sufficient to remove all of this charge, leaving the voltage on floating diffusion node 23 reduced by an amount that depends on the amount of charge transferred and the capacitance of capacitor 23'. Hence, by measuring the change in voltage on floating diffusion node 23 after gate 25 is opened, the accumulated charge can be determined.

If the reset voltage on floating diffusion node 23 is sufficiently reproducible, then a single measurement of the voltage on floating diffusion node after reset is sufficient. However, noise results in small variations in the reset voltage. If this noise is significant, a correlated double sampling algorithm can be utilized. In this algorithm, floating diffusion node 23 is first reset to Vr using reset gate 24. The potential on floating diffusion node 23 is then measured by connecting source follower 26 to readout line 31 by applying a select signal to line 28 to a readout gate. This reset potential is stored in column amplifier 32. Next, gate 25 is placed in a conducting state and the charge accumulated in photodiode 22 is transferred to floating diffusion node 23. It should be noted that floating diffusion node 23 is effectively a capacitor that has been charged to Vr. Hence, the charge leaving photodiode 22 lowers the voltage on floating diffusion node 23 by an amount that depends on the capacitance of floating diffusion node 23 and the amount of charge that is transferred. The voltage on floating diffusion node 23 is again measured after the transfer. The difference in voltage is then used to compute the amount of charge that accumulated during the exposure.

The present invention is based on the observation that a pixel of the type discussed above can be modified to include a second parasitic photodiode that is part of the floating diffusion node and has a significant photodiode detection efficiency. This second light detector does not significantly increase the size of the pixel, and hence, the present invention provides the advantages of a two photodiode pixel without significantly increasing the pixel size.

Figure 2:
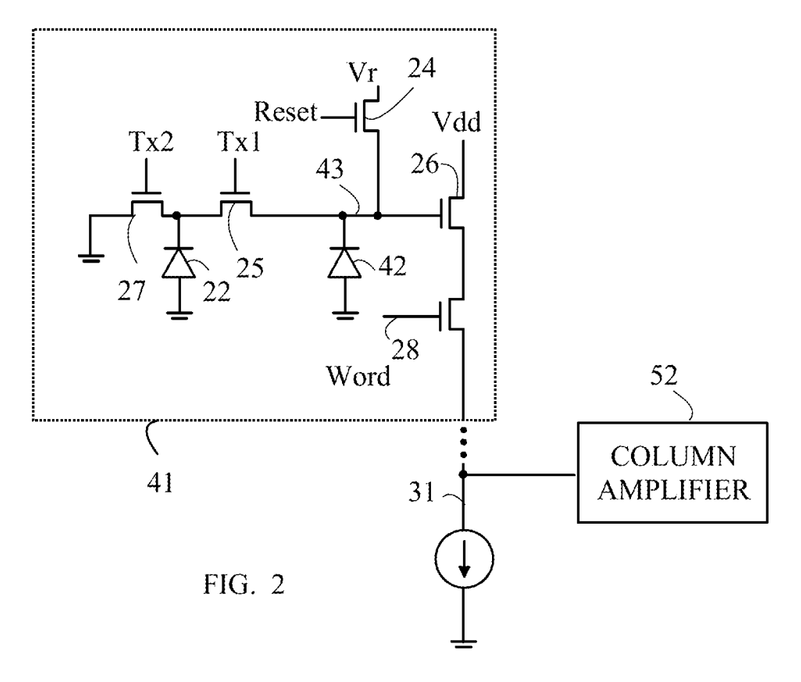
FIG. 2 illustrates a pixel sensor in which the parasitic photodiode is utilized in an image measurement.

To distinguish the parasitic photodiode from photodiode 22, photodiode 22 and photodiodes serving analogous functions will be referred to as the "conventional photodiode". Refer now to FIG. 2, which illustrates a pixel sensor in which the parasitic photodiode is utilized in an image measurement. To simplify the following discussion, those elements of pixel sensor 41 that serve functions analogous to those discussed above with respect to FIG. 1 have been given the same numeric designations and will not be discussed further unless such discussion is necessary to illustrate a new manner in which those elements are utilized. In general, parasitic photodiode 42 has a detection efficiency that is significantly less than that of photodiode 22. The manner in which the ratio of the photodiode detection efficiencies of the two photodiodes is adjusted will be discussed in more detail below.

The manner in which pixel sensor 41 is utilized to measure the intensity of a pixel in one embodiment of the present invention will now be explained in more detail. The process may be more easily understood starting from the resetting of the pixel after the last image readout operation has been completed. Initially, main photodiode 22 is reset to Vr and gate 25 is closed. This also leaves floating diffusion node 43 reset to Vr. If a correlated double sampling measurement is to be made, this voltage is measured at the start of the exposure by connecting floating diffusion node 43 to column amplifier 52. Otherwise, a previous voltage measurement for the reset voltage is used. During the image exposure, parasitic photodiode 42 generates photoelectrons that are stored on floating diffusion node 43. These photoelectrons lower the potential on floating diffusion node 43. At the end of the exposure, the voltage on floating diffusion node 43 is measured by connecting the output of source follower 26 to column amplifier 52, and the amount of charge generated by parasitic photodiode 42 is determined to provide a first pixel intensity value. Next, floating diffusion node 43 is again reset to Vr and the potential on floating diffusion node 43 is measured by connecting the output of source follower 26 to column amplifier 52. Gate 25 is then placed in the conducting state and the photoelectrons accumulated by main photodiode 22 are transferred to floating diffusion node 43. The voltage on floating diffusion node 43 is then measured again and used by column amplifier 52 to compute a second pixel intensity value.

If the light intensity on the corresponding pixel was high, main photodiode 22 will have overflowed; however, parasitic photodiode 42, which has a much lower conversion efficiency, will have a value that is within the desired range. On the other hand, if the light intensity was low, there will be insufficient photoelectrons accumulated on parasitic photodiode 42 to provide a reliable estimate, and the measurement from main photodiode 22 will be utilized.

The above-described readout strategy assumes that the ratio of the light detection efficiency of main photodiode 22 and parasitic photodiode 42 is adjusted such that the values obtained from parasitic photodiode 42 are complementary to those obtained from main photodiode 22. If parasitic photodiode 42 has too low a light detection efficiency, the intensity values obtained from parasitic photodiode 42 when main photodiode 22 has become saturated will be too low or too noisy to provide a pixel value of the desired accuracy. Similarly, if the light detection efficiency of parasitic photodiode 42 is too high, a useful extension of the dynamic range of the pixel sensor will not be achieved.

Figure 3:
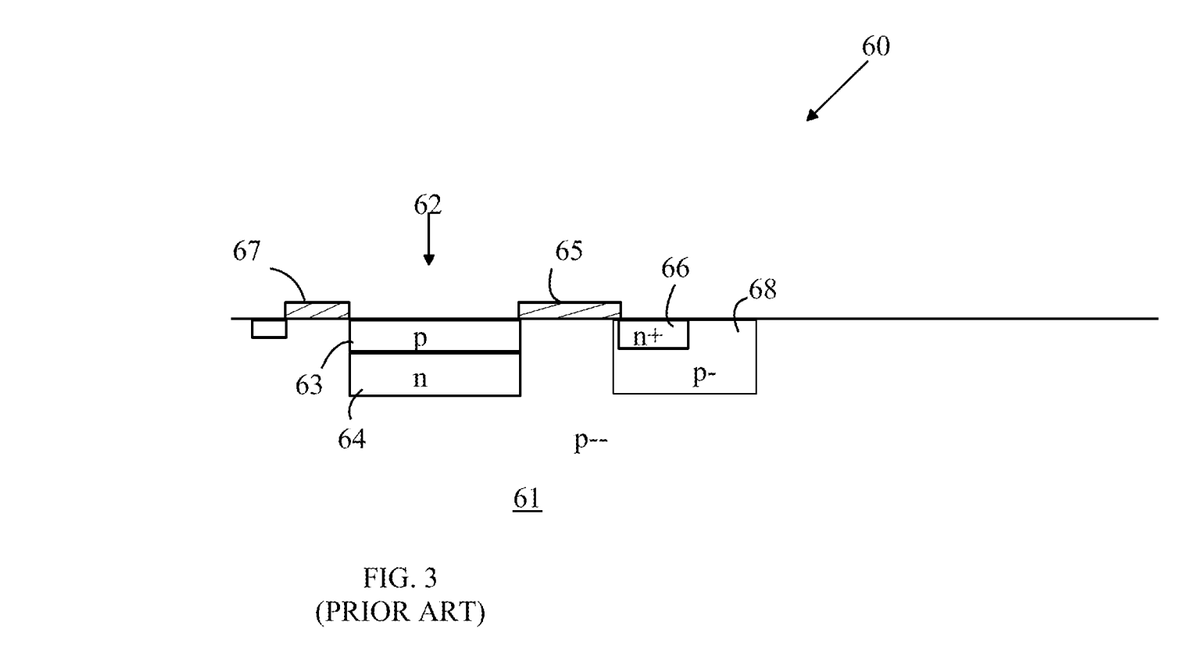
FIG. 3 is a cross-sectional view through a portion of a typical prior art pixel sensor.

The manner in which the detection efficiency of the floating diffusion node is adjusted will now be explained in more detail with reference to FIGS. 3 and 4. Prior art pixel sensors are designed to minimize the photo-conversion efficiency of the floating diffusion node. Refer now to FIG. 3, which is a cross-sectional view through a portion of a typical prior art pixel sensor. To simplify the drawing, a number of implants that are not central to the present invention have been omitted. Pixel sensor 60 is fabricated in a p--type substrate 61. Main photodiode 62 is a pinned photodiode and is constructed from a p type implant 63 at the surface of p--type substrate 61 and an n-implant 64. The p-implant reduces the dark current. The photodiode junction is the junction between n-implant 64 and p--type substrate 61. The gate electrodes corresponding to gates 25 and 27 are shown at 65 and 67, respectively.

The floating diffusion node includes an n+ implant 66 that is surrounded by a p− implanted region. The difference in doping between p−−-type substrate 61 and p− well 68 in which the floating diffusion node is constructed provides a potential barrier that reduces the light collection efficiency of the parasitic photodiode formed by implant 66 and p−−-type substrate 61. This difference inhibits electrons and holes generated in p−−-type substrate 61 from being collected by the parasitic photodiode. In one exemplary embodiment, p type implant 63 has a doping density approximately equal to $5\times10^{18}$ atoms/cm$^3$. Region p− has a doping density approximately equal to $10^{17}$ atoms/cm$^3$, and p−−-type substrate 61 has a doping density approximately equal to $10^{15}$ atoms/cm$^3$.

As noted above, prior art pixel sensors are designed to reduce or eliminate the parasitic photodiode action. The p− well 68 greatly reduces the size of the depletion region associated with the n+ implant of the floating diffusion node. In addition, prior art pixel sensors often include a metal mask over the floating diffusion node to block light from reaching the floating diffusion node.

The present invention provides its advantages by increasing this parasitic photodiode light conversion efficiency and by removing any metal mask so as to provide a usable second photodiode in each pixel sensor without substantially increasing the size of the pixel sensors.

Controlling the relative light detection efficiencies of the two photodiodes is important. The goal of the pixel is to provide a measurement of light intensities over a range of light intensities that is greater than that achievable with the conventional photodiode alone. Hence, when the light intensity is too high to be measured by the conventional photodiode, the signal from the parasitic photodiode must have sufficient accuracy to provide the measurement of the intensity. If the light conversion efficiency of the parasitic photodiode is too low, there will be a "hole" in the intensity coverage. If the light conversion efficiency is too high, the total dynamic range of the pixel sensor will be reduced relative to that obtainable with the ideal ratio of conversion efficiencies.

The light conversion efficiency of the parasitic photodiode can be altered by removing p− well 68, thereby creating a conventional photodiode that is similar to that of a conventional photodiode. If the p− well is removed, the light conversion efficiency of the floating diffusion node is increased to its maximum value for any given area of the n+ implant. It has been found experimentally, that this solution leads to a parasitic photodiode that has too high of a light conversion efficiency. In principle, the relative efficiencies of the two photodiodes can be adjusted by changing the area of n+ implant 66 relative to the area of n implant 65. However, in practice, the area of n+ implant 66 is constrained by other considerations. The area of n+ implant 66 determines the capacitance of the floating diffusion node. This capacitance, in turn, determines the charge-to-voltage conversion ratio of the source follower in the pixel sensor. If the area of n+ implant 66 is reduced, the dynamic range of the charge measurement is reduced, as the charge-to-voltage conversion will increase; however, the maximum voltage swing that can be measured by the source follower remains constant.

Figure 4A:
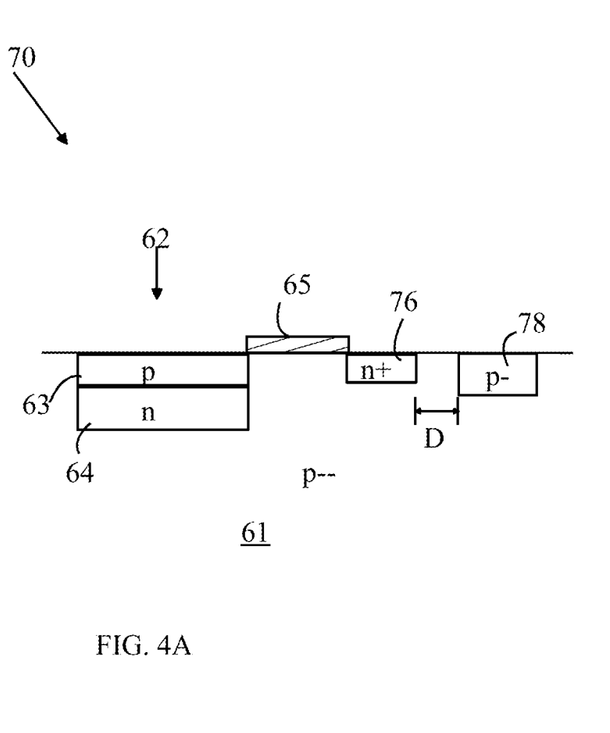
FIGS. 4A and 4B illustrate a pixel sensor according to one embodiment of the present invention.
Figure 4B:
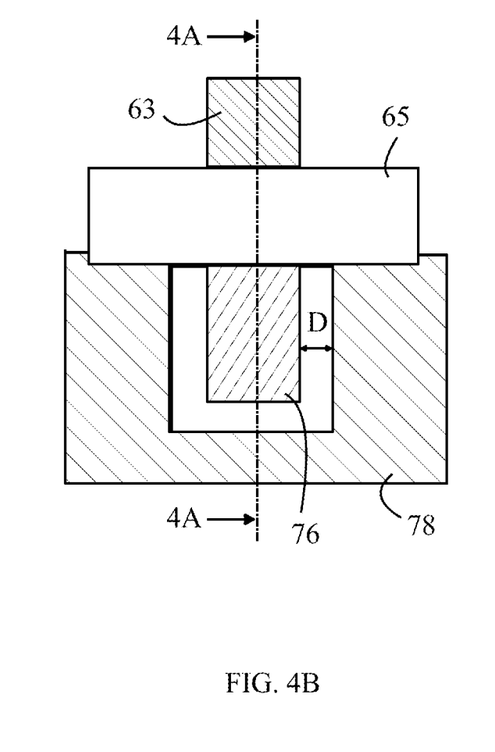

Refer now to FIGS. 4A and 4B which illustrate a pixel sensor according to one embodiment of the present invention. FIG. 4A is a cross-sectional view of a portion of a pixel sensor 70 through line 4A-4A shown in FIG. 4B, which is a top view of pixel sensor 70. To simplify the following discussion, those elements of pixel sensor 70 that serve functions analogous to those served by elements in FIG. 3 have been given the same numeric designations and will not be discussed in detail again. In addition, gate 67 has also been removed to simplify the drawings.

In pixel sensor 70, the p− implant 78 associated with n+ implant region 76 that forms the floating diffusion node has been removed from n+ implant region 76 and replaced by a p− implant 78 that is displaced from n+ implant region 76 by a distance, D. P− implant 78 reduces the light conversion efficiency of n+ implant region 76 by limiting the size of the depletion region around n+ implant region 76. Larger values of D provide less limitations, and hence, higher light conversion efficiencies. Thus by altering the value of D, the ratio of the light conversion efficiencies of the conventional photodiode and the parasitic photodiode can be controlled without altering the size of n+ implant region 76. In one exemplary embodiment, D is between 0.1 μm and 0.3 μm.

As noted above, there is a light intensity-exposure time at which the main photodiode saturates. For exposures that are greater than this exposure, the additional photoelectrons are removed from the photodiode, and hence, the output of the main photodiode does not change with additional exposure. This exposure will be referred to as the main photodiode saturation exposure in the following discussion. The light collection efficiency of the parasitic photodiode is preferably set such that sufficient photoelectrons are generated in the parasitic photodiode at the main photodiode saturation exposure to provide a good measurement of the light intensity for exposures at or greater than the main photodiode saturation exposure up to some upper exposure limit, and hence, the resulting pixel sensor will have an improved dynamic range compared to a pixel sensor that does not utilize such a parasitic photodiode.

The optimum ratio between the light conversion efficiencies of the main photodiode and the parasitic photodiode will depend on the noise levels in the parasitic photodiode. In general, the noise level in the parasitic photodiode will be greater than that in the main photodiode, since the parasitic photodiode is not a pinned photodiode. Hence, a greater exposure will be needed to provide a pixel intensity measurement with some predetermined signal-to-noise ratio. In addition, the light conversion efficiency of the parasitic photodiode must be less than that at which the capacity of the parasitic photodiode to hold the charge is exceeded to prevent image artifacts such as blooming when a few pixels have very high exposures. In one aspect of the invention, the light conversion efficiency of the parasitic photodiode is greater than $\frac{1}{30}$th of the light conversion efficiency of the main photodiode. In another aspect of the invention, the light conversion efficiency of the parasitic photodiode is greater than $\frac{1}{20}$th of the light conversion efficiency of the main photodiode. In yet another aspect of the invention, the light conversion efficiency of the parasitic photodiode is greater than $\frac{1}{10}$th of the light conversion efficiency of the main photodiode.

Figure 5:
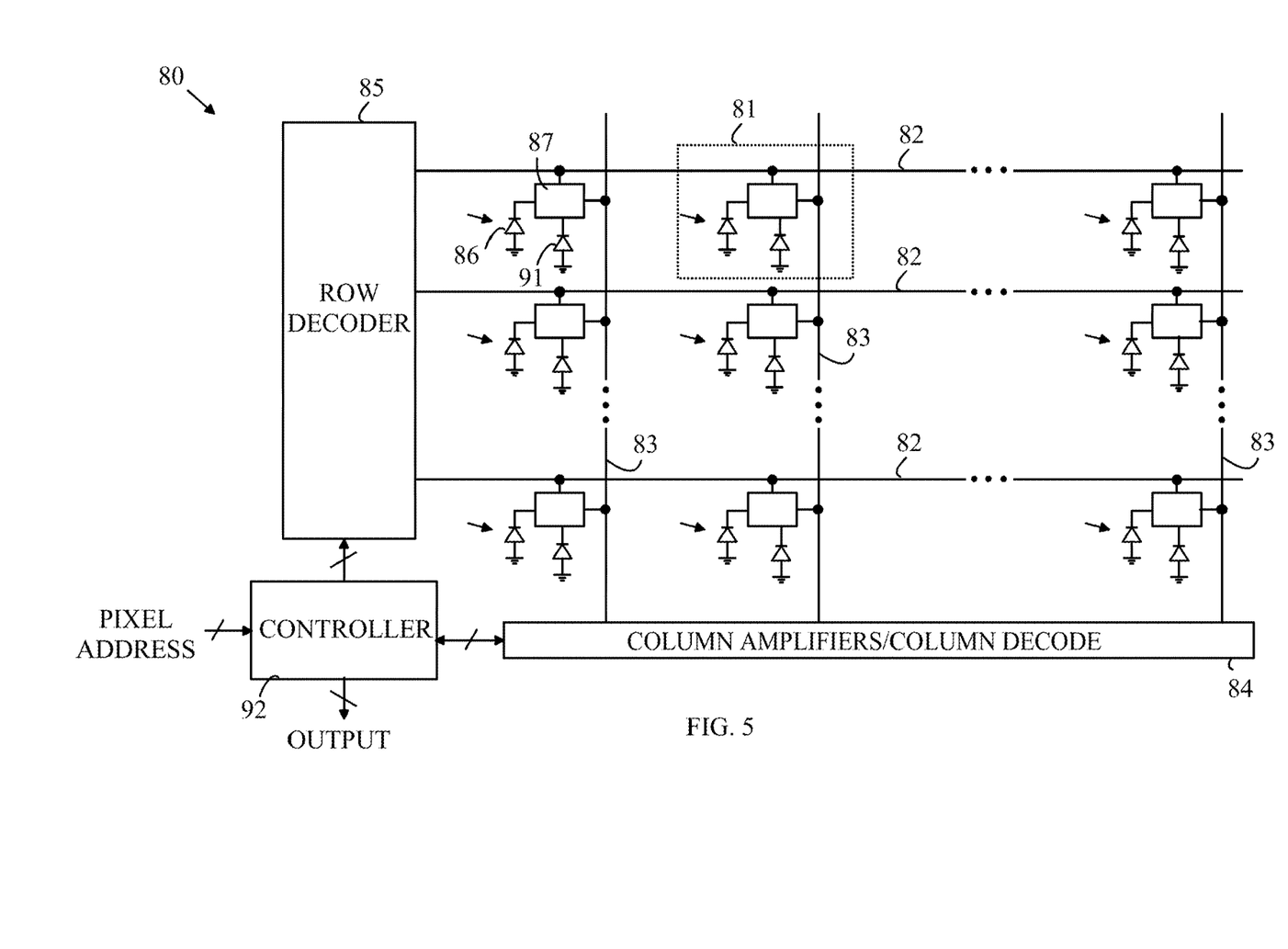
FIG. 5 illustrates a two-dimensional imaging array constructed from pixel sensors according to the present invention.

A pixel sensor according to the present invention can be utilized in a number of different camera or light sensing operations. Refer now to FIG. 5, which illustrates a two-dimensional imaging array constructed from pixel sensors according to the present invention. Imaging array 80 includes a two-dimensional array of pixel sensors 81. Each pixel sensor has a main photodiode 86 and a parasitic photodiode 91 and operates in a manner analogous to that discussed above. The reset circuitry and amplification circuitry in each pixel is shown at 87. The pixel sensors are arranged as a plurality of rows and columns. Each pixel sensor in a column is connected to a readout line 83 that is shared by all of the pixel sensors in that column. The readout lines are analogous to readout line 31 shown in FIG. 2. Each pixel sensor in a row is connected to a row select line 82 which determines which pixel sensor in that row is connected to the corresponding readout line. For example, the row select line can be connected to line 28 shown in FIG. 2.

The operation of imaging array 80 is controlled by a controller 92 that receives a pixel address to be readout. Controller 92 generates a row select address that is used by row decoder 85 to enable the readout of the pixel sensors on a corresponding row in imaging array 80. The column amplifiers are included in an array of column amplifiers 84 which execute the readout algorithm discussed above. It should be noted that if readout time is not critical, a single readout amplifier could be shared between the various readout lines, the currently active readout line being determined by a column decoder or multiplexer.

The imaging array shown in FIG. 5 is an exemplary imaging array. It is to be understood that other imaging array configurations that utilize the pixel sensors of the present invention could also be constructed. For example, a one-dimensional imaging array that includes a single column of pixels could be constructed for use in a scanner in which the image is swept past the column of pixel sensors in a direction perpendicular to that of the columns of pixel sensors.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A pixel sensor comprising:
   a photodiode characterized by a first light conversion efficiency;
   a floating diffusion node;
   a gate that selectively connects said photodiode to said floating diffusion node; and
   a readout amplifier that generates a signal indicative of a potential on said floating diffusion node,
   wherein said floating diffusion node comprises a parasitic photodiode characterized by a second light conversion efficiency, said second light conversion efficiency being greater than or equal to $1/30$ times said first light conversion efficiency, said floating diffusion node comprising an n-type implanted region in a p-type substrate, said n-type implant region being separated from a p-type implant region by a distance that is chosen to provide said second light conversion efficiency.

2. The pixel sensor of claim 1 further comprising an overflow gate connected to said photodiode, said overflow gate removing charge from said photodiode if a potential on said photodiode exceeds an overflow potential.

3. The pixel sensor of claim 1 wherein said photodiode comprises an n-type implanted region in a p type substrate.

4. The pixel sensor of claim 1 wherein said photodiode is a pinned photodiode.

5. An imaging array comprising a plurality of pixel sensors connected to a readout line, each pixel sensors comprising:
   a photodiode characterized by a first light conversion efficiency;
   a floating diffusion node;
   a gate that selectively connects said photodiode to said floating diffusion node;
   a readout amplifier that generates a signal indicative of a potential on said floating diffusion node, said signal being coupled to a first conductor in response to a select signal being received by said pixel sensor;
   a reset gate that selectively connects said floating diffusion node to a reset bus at a reset potential; and
   a readout gate that connects that pixel sensor to said readout line, wherein
   said floating diffusion node comprises a parasitic photodiode characterized by a second light conversion efficiency, said second light conversion efficiency being greater than or equal to $1/30$ times said first light conversion efficiency, said floating diffusion node comprising an n-type implanted region in a p-type substrate, said n-type implant region being separated from a p-type implant region by a distance that is chosen to provide said second light conversion efficiency.

6. The imaging array of claim 5 further comprising an overflow gate connected to said photodiode, said overflow gate removing charge from said photodiode if a potential on said photodiode exceeds an overflow potential.

7. The imaging array of claim 5 wherein said photodiode comprises an n-type implanted region in a p-type substrate.

8. The imaging array of claim 5 wherein said photodiode is a pinned photodiode.

* * * * *